United States Patent [19]
Dorrough et al.

[11] Patent Number: 4,528,501
[45] Date of Patent: Jul. 9, 1985

[54] DUAL LOUDNESS METER AND METHOD

[75] Inventors: Michael L. Dorrough, Woodland Hills; Kenneth S. Gold, Canoga Park, both of Calif.

[73] Assignee: Dorrough Electronics, Woodland Hills, Calif.

[21] Appl. No.: 378,217

[22] Filed: May 14, 1982

Related U.S. Application Data

[63] Continuation-in-part of Ser. No. 252,807, Apr. 10, 1981, abandoned, and a continuation-in-part of Ser. No. 279,305, Jul. 1, 9181, abandoned.

[51] Int. Cl.³ ............... G01R 19/04; G01R 1/00; H04R 25/00
[52] U.S. Cl. ................... 324/103 P; 324/96; 324/114; 324/122; 381/56
[58] Field of Search ............ 324/103 P, 122, 96, 324/114; 381/56

[56] References Cited
U.S. PATENT DOCUMENTS

| | | | |
|---|---|---|---|
| 3,922,666 | 11/1975 | Inami et al. | 324/122 |
| 4,166,245 | 8/1979 | Roberts | 324/103 P |
| 4,183,025 | 1/1980 | Kuraragi et al. | 324/103 P |
| 4,262,255 | 4/1981 | Kokei et al. | 324/96 |

OTHER PUBLICATIONS

Moore, B. C. J.; An Introduction to the Psychology of Hearing; Academic Press, N.Y., N.Y.; 1982; pp. 40–73.
Chinn et al., A New Standard Voltage Volume Indicator and Reference Level, 49 pages.

Primary Examiner—Ernest F. Karlsen
Attorney, Agent, or Firm—Robert B. Block; Lewis Anten

[57] ABSTRACT

A dual loudness meter and method for simultaneously indicating the apparent loudness of composite audio program material representing peak material or of persistent material employing a first detector means responsive to peak signals for instantaneously indicating the same as a singly actuated LED indicator in an array thereof displayed in accordance with the peak strength of the signal, a second detector for detecting the persistence of the signal and displaying the same as a bar graph on said LED display, the materials being colinearlly displayed and having dual upper extreme warning/operating indicator means separated by about 12 to 14 dB so that the meter is read as requiring adjustment of the associated recording or broadcast facilities to avoid having either of said programming indicator displays reading consistently in either warning/operating zone. Specific circuits and time constants of response and decay are given as appropriate to the simultaneous reading, dual meter system disclosed.

15 Claims, 6 Drawing Figures

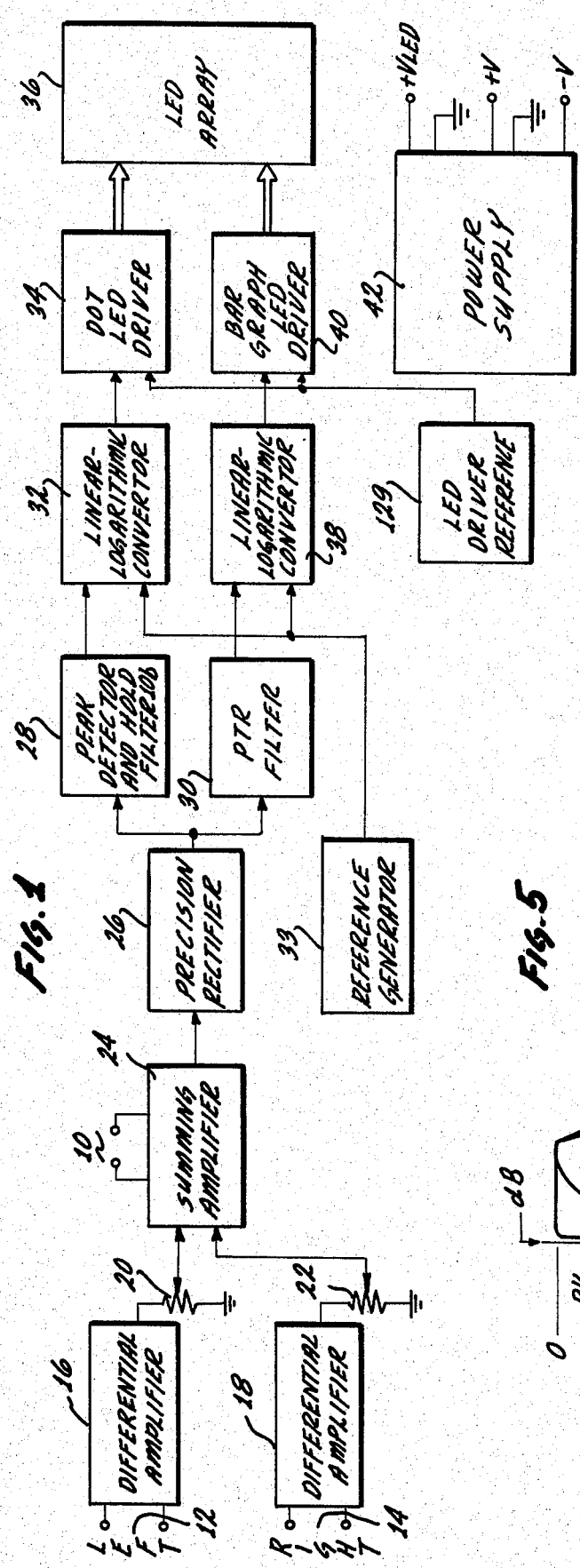
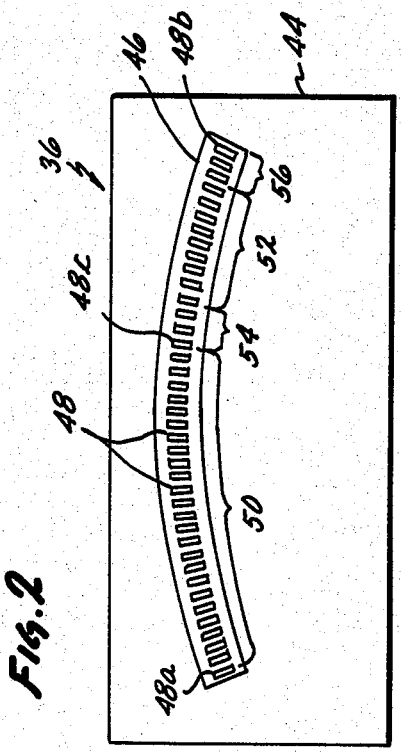
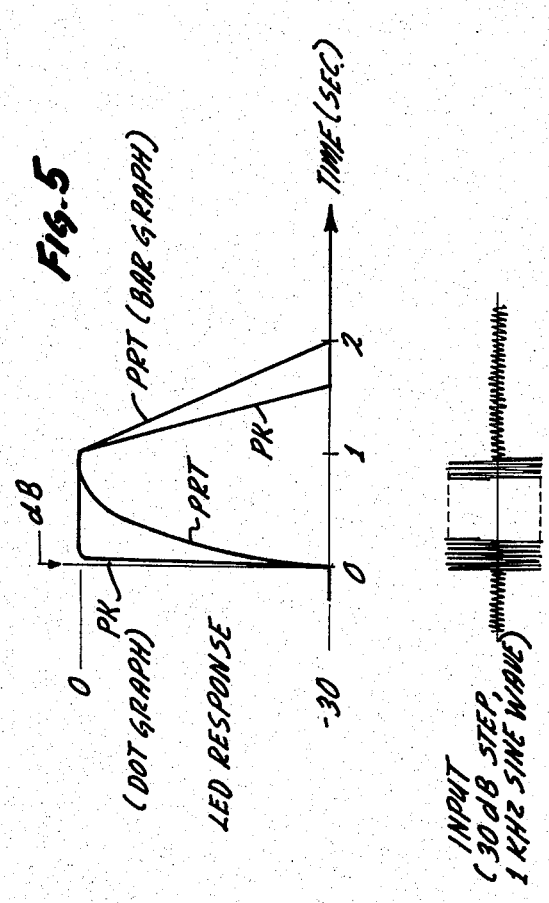

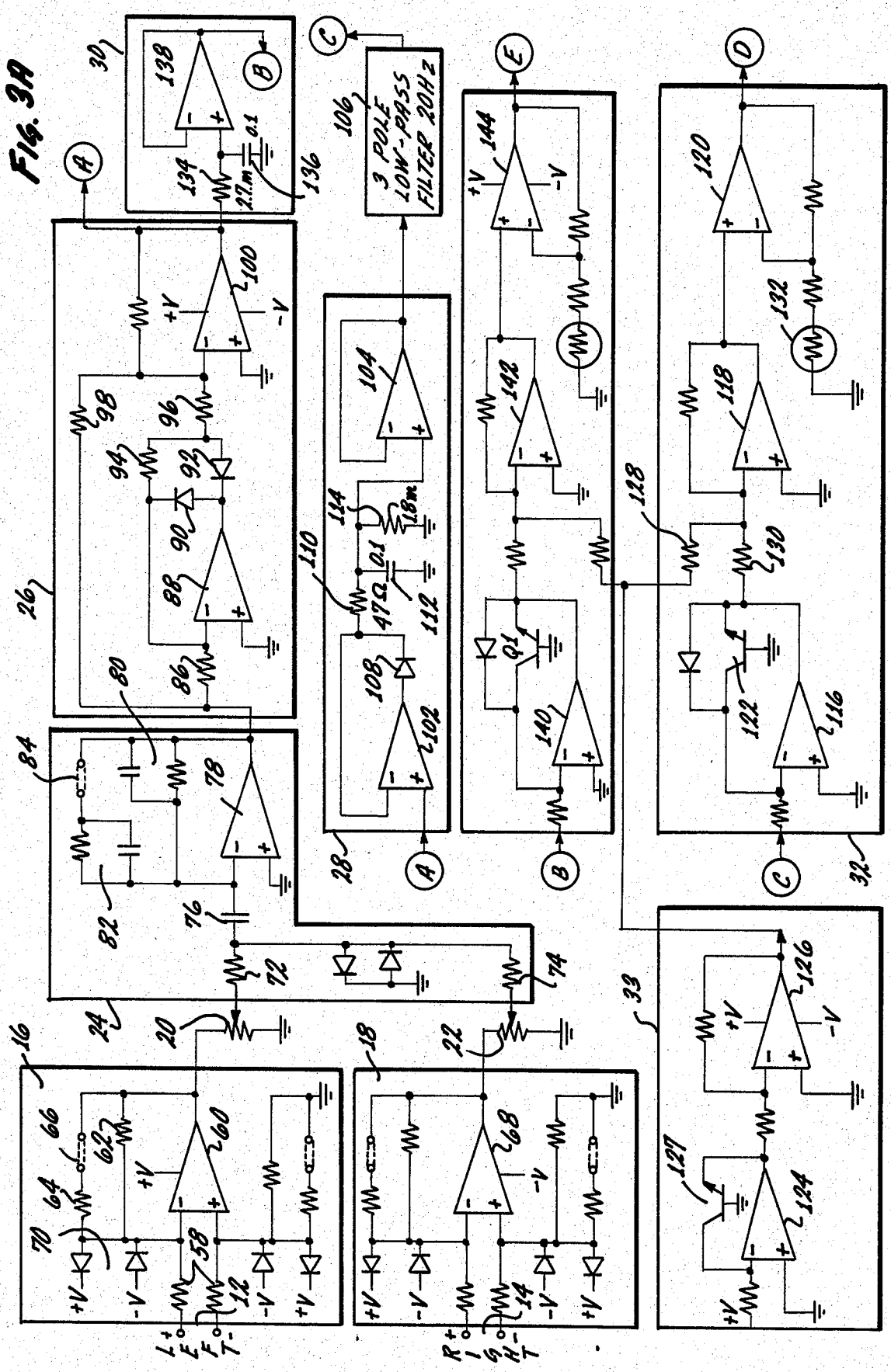

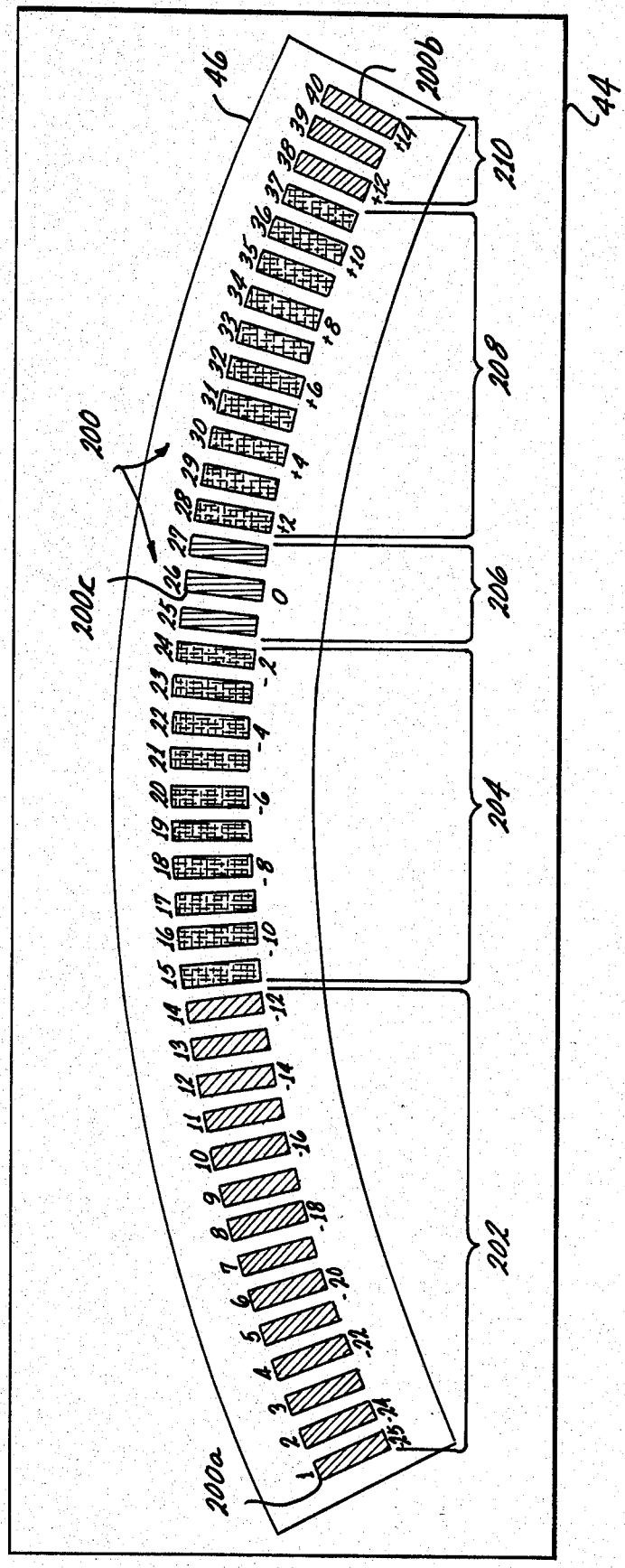

DUAL LOUDNESS METER AND METHOD

CROSS-REFERENCE TO RELATED APPLICATIONS

This application is a continuation in part of our prior patent application Ser. No. 252,807, filed Apr. 10, 1981, now abandoned, entitled "Improved Loudness Meter and Metering Method" and Ser. No. 279,305, filed July 1, 1981, now abandoned, entitled "Improved Meter and Method for Indicating Loudness".

BACKGROUND OF THE INVENTION

The present invention relates generally to the field of audio broadcast and recording instrumentation and, more particularly, to an improved loudness meter and method having a dual response characteristic.

Various meters and metering standards are in use throughout the world to indicate audio program loudness levels. The most well-known standard meters include the VU meter described in ANSI Standard C 16.5R of 1961 and the Peak Power Meter (PPM) described in the Standard IEC 268-10.

The VU meter was developed to define program levels from different sources under dynamic conditions for the use in telecommunications broadcast interface. The VU meter is basically a galvanometer with specific meter ballistics, calibrated in power. The specific meter ballistics require a ninety-nine percent deflection with one percent overshoot upon the application of a sinusoidal voltage of reference amplitude and a rise time of 300 millicycles. It also requires that the decay time fall with the same characteristics. Only meters of this dynamic behavior can be termed VU meters. Because of the substantial integration of program material over the response time of the VU meter the same does not give an accurate representation of short term or peak signal amplitudes. Broadcast engineers have generally gained experience with such meters and are often able to correctly compensate level adjustments so as to equalize the loudness level between peak type sources and persistent sources. Such adjustments are not consistent and are not based upon reproducable experience based on meter readings. Thus, those who work with the VU meter relate its usefulness in setting program levels by adding certain compensations which are generally known in the trade. Such compensations including the riding of dialogue to a level 3 to 5 dB below music and placing drums as much as $-10$ dB below music.

In multi-channel music recording a VU meter rides on each channel and is dedicated to some very small cluster of instruments or a single instrument. The recording engineer acquires a knowledge that given instruments must ride so many db below other instruments or collections of other instruments in order to produce an equal loudness experience to a listener.

In these operations, it is not possible for inexperienced persons to make properly balanced recordings or to control with equal loudness alternating sources of audio input in radio and television broadcasting circuits and even the experts rely on personal expertise.

Thus, out current method of monitoring program levels is found to be inadequate. The standard VU Meter as used in the broadcast industry today does not give a true indication of perceived audio level. A simple experiment on any VU Meter will verify this. Connect a tone generator to an amplifier bridged by a VU Meter. Establish a "0" level and discern the loudness. Now short the generator in rapid session (beep, beep, beep, etc.). Notice that the apparent loudness remains the same but the meter indicator drops several dB. The meter is incapable of showing an accurate reading.

Relating this to the complexities of broadcast audio a typical problem that the VU Meter cannot deal with can be explained in this fashion. Anything musical such as a bass, guitar and piano in composition allows the VU Meter to gain some footing and show a fairly close average to "0" VU whereas a male voice which is very staccato at an average "0" VU reading would in reality be twice as loud.

The erroneous readings of perceived audio in the VU Meter are not just ballistic problems as the VU Meter has a full wave rectifier that converts AC to DC which activates the meter. For example, program sources that are highly asymmetrical such as a solo male voice act upon the rectifier differently than program material that appears more sinuoidal such as music.

The two standard VU Meters used in stereo broadcast create another problem. Consider the following situation and outcome. Generally, two VU Meters appear on the stereo control console. The announcer speaks through both channels to appear mono in the center. His voice level is adjusted to relative "0" on both VU Meters. A transition is made to a stereophonic recording with piano on the left showing a "0" VU reading, and a guitar on the right also showing a "0" VU reading. This typical setup results in the announcer sounding twice as loud because he has twice the acoustical efficiency resulting from his being electrically connected to two channels.

The summation of both left and right on a Total Meter would improve the noted distribution of power overall in the above situation except one is still faced with the ballistics problem inherent in the standard VU Meter.

Broadcast engineers have noticed for years that voice announcements and commercials work audio processing equipment far harder than do recordings as the factors in the above analysis are directing the outcome. Consequently, the broadcaster has had to work with a deeper range with resultant degradation quality in order to hold a more uniform output.

The recording industry is sometimes trapped in this same situation. When instruments, especially those of the low frequency range such as a bass, are mixed on both left and right channels as to appear in the center the resultant mono product contains too much bass. Sometimes this maybe done intentionally and other times it is the outcome of mixing while monitoring both left and right channels. This is commonly known as center channel buildup.

The development of transistor technology placed greater emphasis on the nature of peak amplitudes of program material and has reasserted the need for an alternative indicator to the VU meter. The so-called PPM meter, long popular in Europe, is a meter ballistic with a rise time of ten milliseconds, i.e., thirty times faster, than the ballistics of the VU meter. This allows an indication of peak amplitudes normally ignored by the VU meter. Fall times of the PPM are considerably slower than that of the VU meter, however, and vary from 1.7 seconds to 2.8 seconds depending upon the standard employed. If a studio or facility elects to control its audio level with PPM meters is faces similar outcome as that of the VU meter, i.e., there must exist experienced persons who know the relative loudness of different sources from experience and relate this level to the visual indications of the meter standard. Level adjustment compensations are not convertible for people to communicate the balanced condition when proceeding from source to source.

Although numerous other meters and other metering systems have been designed and marketed in an effort to correct the foregoing limitations and disadvantages, such devices again vary considerably in their ballistics, scale design and the type of readout and have not served to unify the art of loudness level measurement or adjustment. Of course, the simultaneous employment of a VU meter with a PPM meter might be considered, but the outcome requires the operator to keep track of two sets of compensations in order to understand the effect on loudness. An example of a typical combination of peak and average power reading meters using an LED display is set forth in U.S. Pat. No. 4,166,245 to Roberts issued Aug. 28, 1979. However, the relationship and character of the loudness signals simultaneously displayed leaves unresolved the problem of the user combining known or unknown compensations for program material so as to achieve for all program materials an equal loudness impression.

As a general indication of the background of this field, the reference made to the article entitled "A New Standard Volume Indicator and Reference Level" by Chinn, et al. a copy of which is lodged together with this application and is available from the Patent Office. As there pointed out, the VU meter characteristics are rather arbitrary and are selected as a compromise so as to provide a single reading instrument which would have wide applicability. Also the instrument should be compatable with telephone as well as broadcast circuits. The article indicates that it would be desirable to have both an RMS and peak reading instruments, but that at that time it was not possible to achieve the same within the constraints of available instrumentation possibilities given. Also the article points our that the measurement of actual program material has to be considered as distinctly different from the mere statement of the possibility of measuring the characterization of a sine wave input. Thus, the Chinn article analyzes various program materials and shows considerable difference in loudness between them, the effects of phase cancellations, and other variables. It further points out that it cannot be said that a meter is precisely a peak reading meter, a RMS meter, a square law meter, or an averaging meter since they believed that all metering systems are of some intermediate character. The Chinn article states that probably the most important thing not usually measured directly is the time over which the complex loudness wave is integrated by the meter. This characteristic is not to be found directly measured even with some sophisticated electronics. There is, therefore, a need for an improved loudness meter and method which will overcome the above limitations and disadvantages.

SUMMARY OF THE INVENTION AND OBJECTS

It is a general object to provide a dual reading loudness meter and method which will overcome the above limitations and disadvantages.

A further object of the invention is to provide a dual loudness meter of the above character which has its primary purpose the capability of giving a dual visual reading of the loudness effect of various different sorts of program, whether compressed or uncompressed, such readings being commensurate with the actual aural experience of the listener and also commensurate with the limitations of commonly available telecommunications and broadcast circuitry. As such, the dual reading loudness meter and method of the present invention will serve the general purposes of indicating suitable reference level for speech to avoid audible distortion when transmitted through amplifiers, program circuits, radio transmitters, television circuits and alike. It will likewise similarly indicate the limit reference levels for music program material which is more persistent in nature than speech. The method of the present invention may be used for checking transmission losses and gains in extended program network systems by simultaneous measurements at a number of points, it will indicate the comparative loudness with which program will be heard by listeners when finally converted into actual sound waves. It can be used to indicate limit levels to avoid overload and other limiting effects utilized in radio and other transmission systems as well as to recording systems such as magnetic tape recording. Furthermore the instrumentation provided by this invention may be readily referenced with commonly available sinewave continuous tone currents.

While the foregoing objects are different and call upon many different facets of the capability of an instrument, it is found that the instrument herein disclosed nearly serves them all in an appropriate manner. The instrument of the present invention further is capable of being related to headroom characteristics of commonly available equipment, and while this relationship is of an compensatory nature requiring an interpretation by the operator, nevertheless, it is sufficiently accurate and relatable to meter readings as to overcome difficulties of judgment leading to running out of head room, particularly in transistorized equipment where the resultant distortions are intolerable.

The central concept of the present invention is that a peak reading and a persistence reading dual meter is provided which, at its upper dual limits of measurement, yields an equivalent reading to a viewer which corresponds to the loudness effect upon the average listener. The present invention is predicated upon the concept that the instrumentation is subservient to the actual factual findings of listeners. Therefore, a wide variety of program sources, both containing highly peak materials, such as the male human voice, have been compared to other material containing relatively low level of peak content, such as provided by clipped, filtered (fuzz-tone) guitar and other background music material. Further, these were compared with program material which was knowingly compressed a significant degree so that the upper and lower range of loudness of the material was inherently within a very narrow ambit. Various listeners were subject to these several materials. In general, a relatively slow average power loudness metering system was employed and compared with a fast acting, relatively non-integrating, peak metering system. Considering present day technology, these systems were implemented in in solid state circuits which were used to drive LED indicator lamps. The central finding of this research is that a dual reading instrument is required to satisfactorily represent these materials and must separate the peak sounding material from persistent sounding material by about 12 to 14 db., and, if presented in a single display of an easily readable type, a very satisfactory correspondence is achieved between all program materials whether compressed or uncompressed with the loudest compression on the hearer. A further condition was developed that whichever material, whether peak or persistent, provided the first upper limit loudness indication that this would limit the loudness level which could be employed on the composite material. Specifically, this means that if highly-compressed, even loudness musical material were to be compared with a live announcer's uncompressed voice, that the music material would be broadcast some 12 to 14 dB visually (on the persistence display) below the announcer's voice level (on the peak display) in order to maintain an equal loudness sensation to the listener.

The nature of musical, compressed material having a long persistence has to be measured over a period of time or integrated over a period of time in order to achieve a satisfactory correspondence with the listener's perception of the sound before it can be converted into a meter reading. Thus, the VU meter's rise time of 300 milliseconds and decay of 300 milliseconds have provided only one compromise signal integration characteristic. In the present application, it is found that the persistence is best measured over a period of about 600 milleseconds and that when so measured, the build up or integration of sound will not be made so high as to cause the 12 to 14 dB separation to peak information to fill in. Also, the persistence response characteristic of 600 milliseconds given herein is connected to the desired separation of 12 to 14 dB between the two functions of the dual metering reading system. In the specific implementation of circuitry which is disclosed in this application, these figures cannot be disassociated, that is to say a shortening of the 600 millesecond response time will result in undesired build up of signal readout due to the effective integration of the RC networks employed. It is believed that these numbers could be disassociated if the invention were implemented in more sophisticated circuitry. But, even as they are they are found quite satisfactory.

Basically, the present invention provides a visual indicating device which dually displays the composition of acoustically related program material as a relatively fast changing peak amplitude dot LED display underneath which exists a slower building persistence measurement in a bar graph LED display. Although these signals are displayed as separate ranges having upper limits separated by 12 to 14 dB, they are equal in loudness. Therefore, warning indicators are associated with each of the displays at the upper limit of the ranges. As has been long known, the observation of complex audio signals on an oscilloscope can be used to develop a long persistence signal in which there is a build up of information when a significant persistence of sound energy over certain periods occurs. In one way, the slow response and other electrical characteristics of the persistence readout display of the present invention provides a similar indication which gives a visual effect similar to the visual effect of a long-persistence oscilloscope watching the same signals. Thus the two pieces of information which describe the composition of acoustically complex signals are separated and are visually relatable to known instruments, such as the oscilloscope, and are also found to be highly relatable to the listener's audio impression. Because of the dual nature of the display, the 600 millisecond rise time or response time of the persistence detection circuit is found to be a median and satisfactory amount. It cannot be made much longer or shorter, but may be varied by about 10% before becoming unsatisfactory.

The display of the present invention consists of a plurality of LED's mounted in a single arched or curved scale so that it is comfortably related visually to the analog meter forms of galvanometer movements. The meter reads from −25 db. at the left through +16 db. at the right. The user's eye movement in reading a changing meter reading is similar to that of reading a conventional VU meter of the galvanometer type moving about on axis normal to the meter face. The circuitry illuminates a single LED to indicate peak level for amplitudes of short duration while a bar graph or a series of LED's are illuminated to indicate information which is generally recurrent or persistent in amplitude. As previously stated, simulated the ballistics (if that be an appropriate expression for solid state circuitry) achieved with the present invention are not patterned necessarily to those of the previous VU or PPM meters, but are instead selected to establish the 12 to 14 dB reference level difference and to accommodate the specific circuitry disclosed for implementing this invention.

Preferably, a single scale is utilized with both of the dual circuits energizing any one of the appropriate LED's of the scale. Warning indicators are given at the end of each respective range of the scale. Since the peak readings scale continues well beyond the persistence scale, the electrical arrangement is such as to blank the peak scale when it would overread the warning indicators of the persistence scale.

Perceived loudness to the ear from source to source is determined by the function of which circuit, peak or persistence, is first to illuminate its respective set of warning indicators.

Program adjustments for equal perceived loudness are made by establishing and holding either the peak or persistence excursions to its corresponding warning area.

An additional feature of importance to stereophonic broadcasting is the provision of a left and right program input which is combined within the instrument and displayed in a single indicating manner. Observation of the display so energized advises the operator of proper operating levels so as to avoid center-channel build up caused by inphase dual monophonic program material sources which often make such material perceived as louder than stereophonic material. The adjustment of program levels using the instrument of the present invention indicates a composite material as well as peak and persistence loudness levels, provides a more consistent input to audio processing equipment, and results in more consistent audio processing and lessened listener fatigue.

These and other objects and features of the invention will become apparent by reference to the accompanying detailed description and claims when taken in conjunction with the accompanying drawings.

BRIEF DESCRIPTION OF THE DRAWINGS

FIG. 1 is a block diagram of a dual loudness meter constructed in accordance with the present invention.

FIG. 2 is a front view of the indicating panel of a loudness meter constructed in accordance with the invention of FIG. 1.

FIGS. 3a and 3b together comprise a simplified schematic diagram of the loudness meter of FIG. 1.

FIG. 4 is a front view of an alternative embodiment of a loudness meter display constructed in accordance with the present invention which may be used alternatively to that shown in FIG. 2.

FIG. 5 is a series of graphs depicting the performance characteristics of the meter of FIGS. 1 through 4.

DETAILED DESCRIPTION OF THE PREFERRED EMBODIMENTS

Figure 3B:
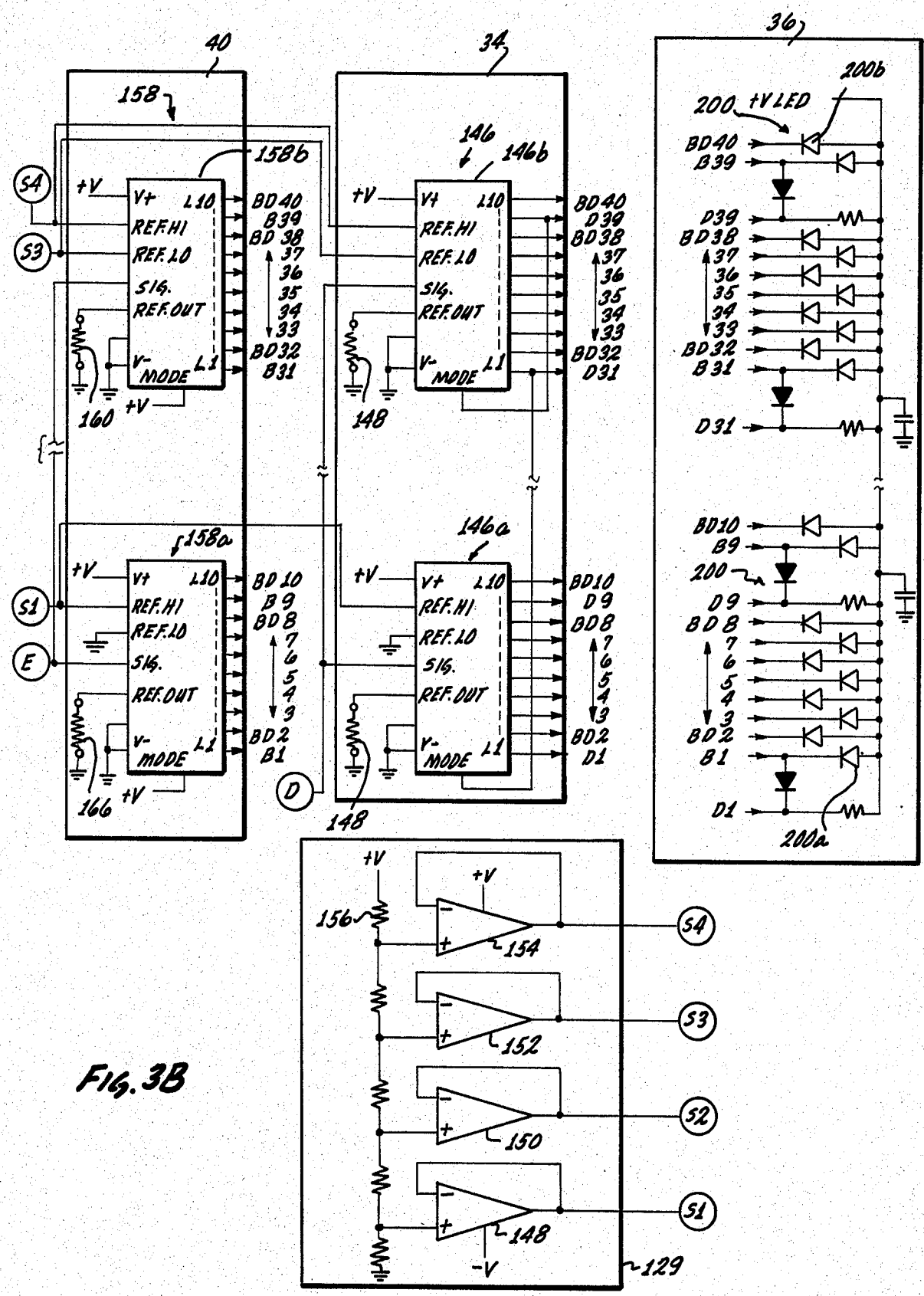

With reference now to FIG. 1, the dual meter 10 of this invention is shown and may have audio program material applied to it such as a stereo left channel 12 and a stereo right channel 14. Both the left channel 12 and the right channel 14 are applied to individual differential amplifiers 16 and 18 of similar characteristics. In the embodiment of FIG. 1, the differential amplifiers 16 and 18 are of selectable gain to accommodate various signal levels which may be utilized in the audio industry. The outputs of the amplifiers 16 and 18 are applied through respective level adjustment potentiometers 20 and 22 to a summing amplifier 24. As with the differential amplifiers 16 and 18 the gain of the summing amplifier 24 is adjustable in accordance with the gains of the amplifiers 16 and 18 to provide a suitable output to a precision rectifier 26.

The precision rectifier 26 rectifies the signal from the amplifier 24 and applies the rectified signal to a peak detector and hold circuit 28 and to a filter 30.

The peak detector and hold circuit 28 detects the substantial peak of the rectified signal applied thereto and provides an output to a linear-logarithmic converter 32.

The output from the converter 32 is in turn applied to a "dot" light emitting diode (LED) driver 34. This driver converts the signal from the converter 32 into one drive signal tht is applied to one of a plurality of drive lines connected to an LED array 36. The array 36 includes a plurality of LED devices as is described more fully with respect to FIGS. 2 and 4. In response to this signal, one LED of the array 36 is illuminated to thereby display a "dot" of light in the array 36.

With continued reference to FIG. 1, the filter 30 filters the output from the precision rectifier 26 and provides an output signal that has a predetermined characteristic is accordance with the time constant of the filter 30. This signal is applied to a second linear-logarithmic converter 38 which is similar to the converter 32. The output of this second converter 38 is in turn applied to a bar graph LED driver 40. This driver 40 provides a plurality of outputs to the LED array 36 which illuminate a plurality of adjacent LEDs within the array 36 to provide what may be termed a "bar graph" presentation of the signal applied to the driver 40. The bar graph presentation is more fully described hereinbelow.

The meter 10 include a suitable power supply 42 of a conventional design which provides power to the meter 10 in a manner which is well known to those skilled in the art.

Turning now to FIG. 2, the meter 10 of FIG. 1 may include a face plate 44 which includes aperture 46 formed therein. In the embodiment of FIG. 2, the aperture 46 may be slightly curved to simulate a conventional glavanometer face. Disposed within the aperture 46 are a plurality of light emitting diodes (LEDs) 48. In the exemplary embodiment, a total of forty LEDs are disposed within the aperture 46, although other suitable quantities of LEDs may be employed.

The LEDs 48 may comprise a first portion 50, the LEDs of which, when illuminated, provide a first color such as green. Further, the LEDs 48 can include a second portion 52 comprising LEDs which, when illuminated, emit a second color such as red. Separating the first portion 50 and the second portion 52, are a plurality of threshold indicating LEDs 54 which, when illuminated, emit a third color such as yellow. Similarly, a plurality of yellow threshold indicating LEDs 56 may be disposed at the end of the second portion 52. It is to be recognized that the threshold indicating LEDs 54 and 56 may be replaced by suitable indicia upon the meter face 44 to thereby indicate a first and second threshold corresponding to the positions of the threshold indicating LEDs 56 and 54, respectively, and that other suitable means for displaying color can be employed.

Another embodiment of a face for the meter 10 is illustrated in FIG. 4. The remaining portions of the meter 10 remain substantially unchanged when used with the face of FIG. 4. In this embodiment, the face plate 44 includes the aperture 46 which may be slightly curved. Disposed within the aperture 46 are a pluarlity of light emitting diodes 200. In the embodiment of FIG. 4, a total of forty LEDs are within the aperture 46, although other suitable quantities of LEDs may be employed.

The LEDs 200 are distinguished into five distinct portions 202-210 by means of the colors emitted by the LEDs 200. For example, the first portion 202 may emit a first color, such as green, the second and fourth portions 204, 208 may emit a second color such as yellow, and the third and fifth portions 206 and 210 may emit a third color such as red. Other means for dividing the LEDs 200 into the five portions 202-210 may be used, such as printed indicia on the face plate 44. In the embodiment of FIG. 4, the first portion 202 comprises fourteen LEDs 200, the second and fourth portions 204, 208 each comprise ten LEDs 200, and the third and fifth portions 206, 210 each comprise three LEDs 200, The fifth portion 210 represents a first threshold or maximum for the peak signal level indication provided by the meter 10. In particular, the rightmost LED 200b represents an absolute peak signal level maximum below which the left and right channel 12, 14 signals should be maintained. Similarly, the third portion 206 represents a second threshold or maximum for the persistence and intensity, with a center LED 200c of the third portion 206 representing an absolute maximum persistance and intensity below which the left and right channel 12, 14 signals should be maintained.

In the operation of the meter 10 with reference to FIGS. 1, 2 and 4, the stereo left channel and stereo right channels 12 and 14 are amplified by the differential amplifiers 16 and 18 and the resultant signals are applied through the level adjustment potentiometers 20 and 22 to the summing amplifier 24. The summing amplifier 24 sums the two signals and provides a composite signal to the precision rectifier 26. In response to the signal, the precision rectifier provides a precisely rectified DC output which is applied to the peak detector and hold 28 and the filter 30.

The peak detector and hold 28 determines the substantial peak of the rectified signal and provides an output proportional thereto to the linear-logarithmic converter 32 which provides a logarithmic output to the dot LED driver 34. The driver 34 then causes one of a plurality of outputs to be applied to the LED array 36. As shown in FIGS. 2 and 4, one of the plurality of LEDs (48, FIG. 2; 200, FIG. 4) is illuminated in response to this signal from the driver 34. This peak indicating LED thus represents the peak signal level of the summed signals appearing at the stereo left and right channel inputs 12 and 14. In the exemplary embodiments of FIGS. 2 and 4, the first threshold represented by the threshold-indicating LEDs 56 of FIG. 2 and the fifth portion 210 with the LED 200b of FIG. 4 represents an upper limit or threshold below which the peak level of the combined stereo left and right channel inputs 12 and 14 should be operated. Thus, the meter 10 displays substantially the instantaneous peak combined signal level as compared with a predetermined first threshold.

The response of the peak detector and hold 28 along with the remaining circuitry of the meter 10 determines the response or ballastics of the peak indicating LED, that is, the LED illuminated to show peak signal level. In the exemplary embodiments of FIGS. 1, 2 and 4, this peak indicating LED preferrably has the following ballastic characteristics. When no signals are applied to the left and right channel inputs 12 and 14, no peak indicating LED in the LEDs 48, 200 is illuminated. With this initial condition, the application of a first reference tone comprising a 1000 Hz sinewave signal (600 ohm source impedance) to both the inputs 12 and 14, the amplitude of the tone being preset so that it is just sufficient to illuminate the last LED 48b, 200b as a peak indicating LED, causes the last LED 48b, 200b to illuminate substantially instantaneously.

The fall-time characteristics are set forth with respect to a first LED 48a, 200a and the last LED 48b, 200b of the LEDs 48, 200. The first LED 48a, 200a illuminates as the peak indicating LED when a second reference tone comprising a 1000 Hz sinewave signal (600 ohm source impedance) is applied to inputs 12 and 14, the amplitude of this second reference tone being approximately 39 dB less than the amplitude of the first reference tone. With the last LED 48b, 200b illuminated as the peak indicating LED with the first reference tone as described above, the peak-indicating LED falls from the peak LED 48b, 200b through a range between and including the last LED 48b, 200b and the first LED 48a, 200a, during approximately one second from the time that the first reference tone is removed from the inputs 12 and 14. It is to be appreciated that once the peak-indicating LED falls through this range, no LED of the LEDs 48, 200 illuminated as a peak-indicating LED. Thus, the peak indicating LED has a substantially instantaneous rise time with a relatively slower fall or decay time. The implementation of these characteristics is described with reference to FIG. 3 hereinbelow, but it will be further recognized that other suitable means can provide these desired ballastics.

Moreover, the remaining LEDs are illuminated as peak indicating LEDS sequentially and individually as the amplitude of a reference tone (1000 Hz, 600 ohm source impedance) varies from the amplitude of the second reference tone to the amplitude of the first reference tone in approximately 1-dB steps. Consequently, the LEDs 48, 200 provide an array indicating a total range of about 39 dB in one-dB steps.

Returning to FIG. 1, the rectified output from the precision rectifier 26 is filtered by the filter 30. The time constant of the filter 30 determines the "ballastics" or response of the output signal from the filter 30. This output signal is in turn applied to the second linear-logarithmic converter 38. The resulting signal as applied through the bar-graph LED driver 40 illuminates a series of adjacent ones of the LEDs 48 (FIG. 2), 200 (FIG. 4) to form a bar-graph type representation of the filtered signal from the filter 30, the leading LED of the bar-graph display indicating the intensity and persistence of the signals at the inputs 12 and 14. This bar-graph display will also indicate a buildup of spectral energy of the composite stereo left and right channel signals according to the intensity and persistence of the signals.

In an exemplary embodiment, it has been found that a time constant of the filter 30 of approximately one-quarter second provides a bar-graph indication which, with the peak indication, provides a uniquely valuable indication of perceived loudness. It is to be appreciated that means other than the filter 30 can be used to generate the time constant of the present invention. Moreover, the characteristics of the bar-graph display more particularly set out below take precedence over the particular means used to achieve the display, and thus are to be considered of primary importance when, for example, determining the time constant of the filter 30. The bar-graph display sequentially illuminates adjacent ones of the LEDs 48 (FIG. 2), 200 (FIG. 4) from the first LED 48a, 200a toward the last LED 48b, 200b, the length of the bar graph of illuminated LEDs being dependent upon the signal appearing at the input of the bar-graph LED driver 40. The second threshold established by the threshold indicating LEDs 54 (FIG. 2) and 206 (FIG. 4) provides a predetermined limit or threshold below which it is desired to maintain the bar-graph display.

More particularly, the filter 30 and the remaining circuitry provides the following preferred ballastics of the bar graph and particularly the leading LED thereof (rightmost LED of the bar-graph display as it would appear in FIGS. 2 and 4). With no signals applied to the left and right channel inputs 12 and 14, no bar graph LEDs in the LEDs 48, 200 are illuminated. With this initial condition, the application of a third reference tone identical in characteristics to the first reference tone, causes the leading LED of the bar graph LEDs to reach the last LED 48b, 200b in approximately 0.6 second. It is to be understood that the amplitude of this third reference tone, identical to the amplitude of the first reference tone, is preset prior to being applied to the inputs 12 and 14, and is of just sufficient amplitude to illuminate the last LED 48b, 200b once the bar-graph display stabilizes.

The fall-time characteristics of the bar-graph display are also set forth with respect to the first LED 48a, 200a and the last LED 48b, 200b. The first LED 48a, 200a illuminates as the leading LED of the bar-graph display when a fourth reference tone identical in characteristics to the second reference tone is applied to the inputs 12 and 14 for at least 0.6 second. When the last LED 48b, 200b is illuminated as the leading LED of the bar-graph display as described above with the third reference tone, the leading LED of the bar-graph display falls through the range between and including the last LED 48b, 200b and the first LED 48a, 200a approximately 1.3 seconds from the time that the third reference tone is removed from the inputs 12 and 14. Once the leading LED of the bar-graph display falls through this range, no LED of the LEDs 48, 200 is illuminated as part of the bar graph display. Thus, the bar-graph display has a somewhat faster rise time than the fall time of the peak indicating LED and a somewhat slower fall time than the fall time of the peak indicating LED. Although the filter 30 is described with respect to FIG. 3, it will be understood that other suitable means can produce the desired bar-graph characteristics.

Furthermore, a predetermined relationship between the first threshold and the second threshold contributes to the uniqueness of the present invention. With a fifth reference tone (1000 Hz sinewave, 600 ohm source impedance) having an amplitude approximately 14 dB less than the amplitude of the first reference signal and applied to the inputs 12 and 14 for a period of time sufficient to stabilize the persistence and intensity bar-graph display, the leading LED of the bar-graph display corresponds to the center LED 200c within the third portion 206. This can correspond to an LED 48c in the threshold indicating LEDs 54 of FIG. 2.

A predetermined relationship between the leading LED of the bar graph display and the peak indicating LED serves to provide a further enhancement to the loudness indication of the present invention. Namely, a signal applied to the inputs 12 and 14 for a period of time sufficient to stabilize the persistence and intensity bar-graph display (in the exemplary embodiment set forth herein, the bar-graph rise time of approximately 0.6 second) illuminates the same LED of the LEDs 48 and 200 for both the peak indicating LED and the leading LED of the bar-graph display. This remains true for a signal having an amplitude within the sensitivity range of the meter 10 as indicated by the LEDs 48, 200. As set forth below, the peak-indicating LED can be at a first intensity and the bar-graph LEDs can be at a second lesser intensity, in which case the display would show the lesser intensity bar-graph LEDs with the greater intensity peak-indicating LED at the top of the bar-graph display, obscuring or overriding the leading LED of the bar-graph display.

With particular attention to the exemplary embodiment represented by FIGS. 1 and 4, a reference tone (1000 Hz sinewave, 600 ohms source impedance) at an amplitude of zero dBm (1 milliwatt), applied to inputs 12 and 14 for at least the stabilizing period of the bar-graph display illuminates the center LED 200c as both the peak-indicating LED and the leading LED of the bar graph display. One dB variations from this power level result in corresponding one LED variations in the display, assuming that the variations are of sufficient length to allow the bar-graph display to stabilize. Thus, the meter of FIGS. 1 and 4 has a sensitivity range of about −25 dBm to about +14 dBm. A similar range can apply to the meter of FIGS. 1 and 2.

FIG. 5 shows graphs of the response characteristics of the meter to 1 Kc tone burst 1 second long. The effective response of the persistence indicating circuits is shown by line PRT is about 600 milliseconds as is shown. The decay of PRT is about 1 second. The line PK shows the peak response to be visually instantaneous, while the PK decay is made slightly faster than the PRT decay to enhance ease of viewing.

It should be noted that the build-up characteristics of the circuits is very important and results from a combination of rise time, decay time, and filter constants.

In use, the operator adjusts the operative level of the system so that the level of the channels 12 and 14 are maintained at either the peak indicating LED zone, as established by the threshold indicating LEDs 56 (FIG. 2) or the fifth portion 210 (FIG. 4), or, are maintained at the illuminated bar-graph indicating LEDs zone as established by the threshold indicating LEDs 54 (FIG. 2) and the third portion 206 (FIG. 4). In this way, the perceived loudness of the program material appearing on the stereo left and right channels 12 and 14 summed within the meter circuits, displayed accurately and consistently, and maintained as the program material varies from source to source.

It is an important function of the present invention to also provide a properly additive combination of stereo information and to display this combination in one display. Thus, amplifiers 16 and 18 add the stereo signals and preserve phase information, particularly so that monophonic signals add to cause an increase in reading. This enables proper level adjustments between stereo and monophonic sources.

Turning now to FIG. 3, the stereo left channel 12 is applied through resistors 58 to an amplifier 60 connected as a differential amplifier. A first feedback gain adjustment resistor 62 is provided between the output of the amplifier 60 and the inverting input thereof. A second feedback gain adjustment resistor 64 may also be connected in parallel with the resistor 62 via a selectable strap 66 to thereby vary the gain of the amplifier 60. A second amplifier 68 is connected in a fashion similar to the amplifier 60 and amplifies the stereo right channel 14. The output of the amplifier 60 is provided to the level adjustment potentiometer 20 while the output from the amplifier 68 is applied to the level adjustment potentiometer 22. It is to be noted that a plurality of paired back-to-back diodes 70 protect the amplifiers 60 and 68 from excessive signal levels.

The adjustable wipers of the potentiometers 20 and 22 are connected through respective resistors 72 and 74 to a coupling capacitor 76 which provides an input to the inverting input of a summing amplifier 78. The output of the amplifier 78 is connected through suitable gain and frequency response networks 80 and 82 to the non-inverting input thereof. It is to be noted that the network 82 is selectable via a strap 84 to thereby vary the gain of the amplifier 78. The network 80 and the network 82, when selected, provide the amplifier 78 with frequency response characteristics which cause the amplifier 78 to also operate as a low-pass filter having a cut-off frequency of approximately 25 KHz.

The output of the amplifier 78 is provided through a resistor 86 to the inverting input of an amplifier 88. The registors 96 and 98 are connected to a summing amplifier 100. The amplifier 88 along with diodes 90, 92, resistors 94–98 and 86 and amplifier 100 form the precision rectifier 26 of FIG. 1.

The output from the summing amplifier 100 is applied to the peak detector and hold circuit comprising amplifiers 102, 104, and a three-pole low-pass filter 106. The output of the amplifier 102 is connected through a rectifying diode 108 and a resistor 110 to a peak hold capacitor 112 which is in turn connected to ground. A decay resistor 114 is connected in parallel with the capacitor 112. In the embodiment of FIG. 3, the resistors 110 and 114 are 47 ohms and 2.7M ohms, respectively, and the capacitor is 0.1 uf, thus forming a peak detector circuit with a relatively fast attack response as determined by the resistor 110 and the capacitor 112 but a relatively slow decay response as determined by the resistor 114 and the capacitor 112. This provides the peak indicating LED decay time described above. The capacitor 112 and the resistors 110 and 114 are in turn connected to a buffer amplifier 104 which provides a buffered output to the three pole low-pass filter 106. The filter 106 is of a conventional design and may be, for example, a Butterworth active filter having a 20 Hz corner frequency to thus eliminate ripple which may occur within the signal from the amplifier 104. This in turn provides a more steady display on the front panel 44.

The filter 106 applies a signal to the input of the linear-logarithmic converter 32 (FIG. 1) comprising the amplifiers 116, 118 and 120. A transistor 122 within the feedback path of the amplifier 116 provides the linear-logarithmic conversion. A logarithmic reference voltage provided by two amplifiers 124 and 126 and a transistor 127 in the feedback path of the amplifier 124 is applied through a resistor 128 and is summed with the output of the amplifier 116 which is applied through a resistor 130. This summation compensates for offset which will be introduced by the amplifier 116. The summed signal is buffered via the amplifier 118 and the amplifier 120. The amplifier 120 can include a thermistor 132 as part of its feedback network to compensate the linear-logarithmic converter for temperature drift.

The rectified output from the amplifier 100 is also applied to the filter 30 formed by a resistor 134, a capacitor 136 and a buffer amplifier 138. The resistor 134 and the capacitor 136 form a single-pole R-C filter having a time constant of approximately one-quarter second. Particular, in the embodiment of FIG. 3, the time constant is 0.27 sec. although suitable variations of this time constant within the scope of the present invention will be recognized by those skilled in the art as still providing the desired ballastics of the bar graph display. It is further to be recognized that the bar-graph display ballastics set forth hereinbefore are to be considered to be controlling in the determination of, among factors, the filter time constant. The output from the buffer amplifier 138 is applied to the second linear-logarithmic converter 38 comprising amplifiers 140-144, which is substantially identical to the converter 32 described above. It will be further understood by those skilled in the art that the converters 32 and 38 may be implemented via other suitable means and, for example, may include a diode network in the feedback path of the amplifier 116 rather than the transistor 122 as disclosed herein.

The output from the amplifier 120 is applied to a plurality of LED converters 146 including a first converter 146a and a last converter 146b. . Each of the converters 146 is a type LM3914 which directly drive corresponding ones of the LEDs 48 of FIG. 2 or 200 of FIG. 4. More particularly, in response to reference voltages applied to the REF LO and REF HI terminals of the converter 146a, the signal applied to the SIG input of the converter 146a, when within the voltage limits established at the REF LO and REF HI terminals, causes one of the corresponding outputs L1-L10 to illuminate one of the corresponding LEDs 48 or 200 via the lines D1, BD2-BD8, D9 and BD10. The current flowing through the corresponding LED and thus the brightness of the LED is adjusted by a resistor 148 connected between the REF OUT terminal of the converter 146a and ground. The MODE terminal of the converter 146a is connected to the L1 terminal of the next higher converter and controls the converter 146a such that only one of the corresponding diodes 48 or 200 is illuminated.

The remaining converters 146 are similarly connected. Four amplifiers 148-154 connected to a voltage divider 156 provide four standard signals S1-S4. The S1 signal is connected to the REF HI terminal of the converter 146a and the REF LOW terminal is connected to ground. The REF LOW and REF HI of the remaining converters 146 are connected to consecutive respective pairs of the signals S1-S4 (i.e., S1 and S2, S2 and S3, and S3 and S4) to provide an operating range of the converters 146 from 0 to the level established by S4 which in the embodiment of FIG. 3 is 4 volts.

The output from the amplifier 144 is similarly connected to a plurality of LED converters 158 including a first converter 158a and a last converter 158b. The +V voltage connected to the MODE terminal of the converters 158 cause the converters 158 to consecutively illuminate adjacent ones of the LEDs 48 or 200 in response to the signal from the amplifier 144 to thus provide a bar-graph effect. For example, as the voltage at the SIG terminal of the converter 158a varies within the voltage limits established at the REF HI and REF LO terminals (S1 and ground, respectively), one of the ten LEDs beginning with LED 48a or 200a and connected to the converter 158a via the lines B1, BD2-BD8, B9 and BD10 respectively will be illuminated to indicate the voltage at the SIG terminal and the remaining LEDs below that one LED will also be illuminated, thereby producing a bar or line of illuminated LEDs. Resistors 160 connected to the REF OUT terminals of the converters 158 control the current drawn by the converters 158 through the LEDs 48 or 200 to consequently control the illumination intensity of the LEDs. In an exemplary embodiment, resistors 148 and 160 are selected such that the intensity of the single illuminated LED controlled by the converters 146 is substantially brighter than the consecutively illuminated portions of the LEDs 48 or 200 controlled by the converters 158, thus advantageously distinguishing the peak signal indication from the spectral energy persistence/intensity bar-graph display. It will be further recognized that, by selectively connecting the converters 146 to ones of the diodes 48 which are only to the right of the threshold indicating LEDs 54, FIG. 2, the peak signal indication would then be displayed for all diodes outside of portion 54 to further minimize confusion between the peak indicating LED and the plurality of LEDs illuminated to display the bar graph indication. For the embodiment of FIG. 4, the LEDs in the third portion 206 are not connected to the corresponding converters 146 and thus the peak signal indication can be provided throughout the range between 200a and 200b, inclusive, except within the third portion 206.

It is to be understood that while the exemplary emter 10 described herein sums two signals and produces a display dependent thereon, the present invention is also adaptable for use with a single channel of program material. Moreover, although a single LED array is disclosed herein, it is to be noted that separate but physically associated arrays may be used, one array for the peak signal display and another array for the bar graph display. In the embodiment of FIG. 3, the amplifiers 60, 68, 78, 88, 100, 102, 104 and 138 may be a type TL084 and the amplifiers 116, 118, 120, 124, 126, 140, 142, 144, 148, 150, 152 and 154 may be a type LM 324.

Having given the foregoing description the following comments and instuctions on its implementation should be noted. Firstly, the time constants of the circuit are determined by the characteristics of certain of its components and also the characteristic logrithmic drive amplifiers. More specifically, the peak reading circuit is governed by the time constants established with resistor 110, capacitor 112, and resistor 114, the values being 110 47 ohms (112 0.1 MF and (114) 1.8 megohms. In addition, the three-pole, low pass filter 106 has a cut-off at about 20 cycles and serves to stablize the display as a dominate component of the peak frequency signal drops to lower values. If it is made much lower than 20 cycles; the display becomes too sluggish, whereas if it is much higher than 20 cycles, the display becomes too jumpy. Both of these effects are not easily correlated to the audio signal but appear more as the consequence of instrumentation and metering and therefore should be avoided.

The time constant of the combination of resistor 110 and capacitor 112 results in essentially in an instantaneous peak reading input response. The decay response is simply and decay of the RC time constant of C112 and R114 and is about 1 second. In all events, this decay response is made somewhat shorter than the decay response of the persistence circuit to be given below so that the meter peak indicator reads as an overriding indicator on top of the persistence indicator and always appears to the viewer as arriving at a upper limit quicker than the persistence scale and falling from the upper limit faster as well.

The time constant of the rise time of the persistence circuit are determined by the combination of R134 and capacitor 136 which are R134 is 2.7 meg. ohms and C136 is 0.1 mF. This results in a rise time of about 600 miliseconds which is the same for any strength of step input to the circuit. The fall time is determined by the characteristics of op amp 140 and is essentially logrithmic. Thus, the logrithmic of the decay time will appear at the output of these circuits as about +1.3 seconds and will decay linearly since the logarithm of a logarithmic function is linear. The transistor Q1 and the diode D141 stablize the circuit.

Having thus described one embodiment of the present invention, it is to be understood that numerous equivalents and variations thereof within the scope of the present invention will be apparent to those skilled in the art and that the scope of the present invention is to be accorded the full scope of the appended claims.

What is claimed is:

1. A method for simultaneously displaying dual readings of equivalent loudness of peak type and average persistence type audio program material on a meter connected to a source of electrical signals carrying aid audio program, said source having control means for adjusting the strength of said signals comprising the steps of generating a first drive signal for said meter to give a visual display of instaneous peak amplitude of said signal, generating a second drive signal for said meter independently of said first drive signal and having a rise time of about 600 milliseconds to give a visual display of the average persistence of said signal, said first and second signals having the same relative gain, providing a visual readout and scale on said metering system, designating upper limit reference zones on said readout and scale, one for peak amplitudes and another for average persistence, said reference zones having separation of 12-14 dB, and adjusting the program level with the control means so that one of the peak or the persistence displays reaches its respective reference zone without the other exceeding its respective reference zone.

2. The method as in claim 1 further including designating a warning or reference region on said indicator scale for each of said peak and persistence scale upper limits.

3. The method as in claim 1 further including the step of blanking said indicator from reading peak signal values in the range of said persistence reference zone.

4. The method as in claim 1 further including the steps of setting said peak signal to an instantaneous and decay time of about 0.8-1.0 seconds and said persistence signal to a decay time of about 1 second to 1.3 seconds, and setting in said peak decay time to be shorter than said persistence decay time.

5. The method as in claim 1 further including the step of summing two channels of stereo signals by combining the vector sum of the stereo signals to form a single signal and applying said single signal to said meter.

6. An apparatus for simultaneously displaying dual readings of equivalent loudness of peak type and average persistence type audio program material on a meter connected to a source of electrical signals carrying said audio program, said source having control means for adjusting the strength of said signals comprising means for generating a first drive signal for said meter to give a visual display of instantaneous peak amplitude of said signal, means for generating a second drive signal for said meter independently of said first drive signal and having a rise time of about 600 milliseconds to give a visual display of the average persistence of said signal, said first and second signal generating means having the same relative gain, means for providing a visual readout and scale on said metering system including means designating upper limit reference zones on said readout and scale, one for peak amplitudes and another for average persistence, said reference zones having a separation of 12-14 dB, and means for adjusting program level with the control means so that one of the peak or the persistence level reaches its respective reference zone without the other exceeding its respective reference zone.

7. The apparatus as in claim 6 further including means for blanking said indicator from reading peak signal values in the range of said persistence reference zone.

8. The apparatus as in claim 7 further including means for setting said peak signal to have an instantaneous decay time of about 0.8-1.0 seconds and means for setting said persistence signal to have a decay time of about 1.0 second to 1.3 seconds, said peak decay being set to a value less than said persistence decay time.

9. The apparatus as in claim 7 further including means for summing two channels of stereo information to produce a single output, means for applying said single output to drive said meter.

10. The apparatus as in claim 6 further including means forming a peak signal warning indicator and means forming a persistence signal warning indicator said persistence warning indicator being 12-14 dB lower on the scale than said peak warning indicator.

11. The apparatus as in claim 6 in which said readout includes a series of LED indicators comprising said covering a range from about −25 dB to +14 dB and arranged in an increasing series thereof, said LED indicators forming a single strand adapted to be activated by either the peak detection or the persistence detection circuit, and means for disabling the peak detection circuit whenever it would activate the reference zone of said persistence scale.

12. The apparatus as in claim 6 further in which the peak detection circuit drives the LED's to a higher light intensity output in the presence of the persistence signal.

13. The apparatus of claim 11 further in which said LED indicators are a sufficient number and said detection circuits are constructed in a range as to provide for a 1 dB spacing therebetween.

14. The apparatus of claim 6 further in which said scale visual field is arcuate, being curved to droop downwardly at its extreme ends and is adapted to be read from left to right with the higher values thereof at the right.

15. The apparatus as in claim 6 further including means for designating a warning region on said indicator scale for each of said peak and persistence scale upper limits.

* * * * *